(12) United States Patent
Heidari et al.

(10) Patent No.: US 7,670,452 B2
(45) Date of Patent: Mar. 2, 2010

(54) SEPARATION APPARATUS AND METHOD

(75) Inventors: Babak Heidari, Furulund (SE); Mattias Habenicht, Tågarp (SE)

(73) Assignee: Obducat AB, Malmo (SE)

( * ) Notice: Subject to any disclaimer, the term of this patent is extended or adjusted under 35 U.S.C. 154(b) by 907 days.

(21) Appl. No.: 11/446,965

(22) Filed: Jun. 6, 2006

(65) Prior Publication Data
US 2007/0018358 A1 Jan. 25, 2007

Related U.S. Application Data

(60) Provisional application No. 60/595,123, filed on Jun. 8, 2005.

(30) Foreign Application Priority Data
Jun. 7, 2005 (EP) ................................. 05104935

(51) Int. Cl.
*B32B 38/10* (2006.01)
(52) U.S. Cl. ...................... 156/344; 156/584
(58) Field of Classification Search ................. 156/344, 156/584
See application file for complete search history.

(56) References Cited

U.S. PATENT DOCUMENTS

| | | | |
|---|---|---|---|
| 3,605,180 A | 9/1971 | Harris et al. | |
| 4,504,571 A | 3/1985 | Yamamura et al. | |
| 5,658,416 A | 8/1997 | MacCollum et al. | |
| 6,416,311 B1 | 7/2002 | Springer et al. | |
| 2004/0166653 A1* | 8/2004 | Kerdiles et al. | 438/458 |
| 2004/0170771 A1 | 9/2004 | Bailey et al. | |
| 2005/0150597 A1* | 7/2005 | Henley et al. | 156/344 |

FOREIGN PATENT DOCUMENTS

| | | |
|---|---|---|
| EP | 0 733 455 A2 | 9/1996 |
| WO | WO 99/56928 | 11/1999 |

OTHER PUBLICATIONS

Kono, "Microporous Polyolefin Film and Its Production", Patent Abstracts of Japan of JP Publication No. 2001072788, (Mar. 21, 2001).

\* cited by examiner

*Primary Examiner*—Mark A Osele
(74) *Attorney, Agent, or Firm*—Renner, Otto, Boisselle & Sklar, LLP

(57) ABSTRACT

An apparatus and method are provided for separating two objects attached to each other in a sandwich structure, such as a stamp and a substrate pressed together in an imprint process. The apparatus includes a support structure, carrying first fastening means having a base surface and first gripping means for supporting and holding a first object, second fastening means, positioned opposite to the first fastening means, having second gripping means for holding a second object, and a pulling force mechanism to provide a pulling force at an angle to the normal direction of the base surface for displacing the two fastening means away from each other. Preferably, the second object is gripped at a periphery portion, and the pulling force is angled inwardly from said periphery portion.

10 Claims, 4 Drawing Sheets

SEPARATION APPARATUS AND METHOD

CROSS REFERENCE TO RELATED APPLICATIONS

This application claims the benefit of U.S. Provisional Application No. 60/595,123, filed Jun. 8, 2005, and claims the right to priority based on European Application No. 05104935.1, filed Jun. 7, 2005, the content of each of which is incorporated herein by reference in its entirety.

FIELD OF THE INVENTION

The present invention relates to means for separating objects attached to each other in a sandwich structure. The invention is particularly suitable for separating a stamp from a substrate, which have been attached to each other at facing surfaces with an intermediate layer of a resist material in a lithographic process, such as an imprint process.

BACKGROUND

The trend in microelectronics, as well as in micromechanics, is towards ever smaller dimensions. Some of the most interesting techniques for fabrication of micro and sub micro structures include different types of lithography.

Photolithography typically involves the steps of coating a substrate with a photoresist material to form a resist layer on a surface of the substrate. The resist layer is then exposed to radiation at selective portions, preferably by using a mask. Subsequent developing steps remove portions of the resist, thereby forming a pattern in the resist corresponding to the mask. The removal of resist portions exposes the substrate surface, which may be processed by e.g. etching, doping, or metallization. For fine scale replication, photolithography is limited by diffraction, which is dependent on the wavelength of the radiation used. For fabrication of structures on a scale of less than 50 nm, such a short wavelength is needed that the material requirements on the optical systems will be major.

An alternative technique is imprint technology. In an imprint lithography process, a substrate to be patterned is covered by a mouldable layer. A pattern to be transferred to the substrate is predefined in three dimensions on a stamp or template. The stamp is brought into contact with the mouldable layer, and the layer is softened, preferably by heating. The stamp is then pressed into the softened layer, thereby making an imprint of the stamp pattern in the mouldable layer. The layer is cooled down until it hardens to a satisfactory degree followed by detachment and removal of the stamp. An alternative method is to employ a radiation-curable polymer as the mouldable layer on the substrate. Such a material is typically liquid at room temperature, and may be spun on the substrate surface. The stamp is placed in contact with the mouldable layer to imprint the same, and the radiation-curable layer is subsequently exposed to radiation, typically UV radiation, either through the stamp or the substrate, at least one of which is transparent to UV radiation. Once the layer has cured, the stamp is separated from the substrate for subsequent processing of the substrate.

Separation of objects attached to each other in a sandwich structure in imprint lithography are typically separated in a manual process, by inserting a cutting edge into the periphery portion of the sandwich structure between the stamp and the substrate.

SUMMARY OF THE INVENTION

An object of the invention is to provide a reliable solution for separation of objects attached to each other in a sandwich structure. This object is fulfilled by an apparatus and a method as recited in the appended claims.

More specifically, according to a first aspect the object of the invention is fulfilled by an apparatus for separating two objects attached to each other in a sandwich structure, comprising
   a support structure, carrying
      first fastening means having a base surface and first gripping means for supporting and holding a first object,
      second fastening means, positioned opposite to the first fastening means, having second gripping means for holding a second object, and
      a pulling force mechanism devised to provide a pulling force at an angle to the normal direction of the base surface for displacing the two fastening means away from each other.

In one embodiment the apparatus comprises
   a positioning mechanism for positioning the sandwich structure in the apparatus such that the second fastening means is directed to engage and grip the second object at a periphery portion thereof, from which periphery portion the pulling force mechanism is angled inwards.

In one embodiment the apparatus comprises
   a cutting mechanism, operable to insert a cutting edge between the objects.

In one embodiment the cutting mechanism is connected to the positioning mechanism such that the cutting edge is arranged to be inserted between the objects adjacent to said periphery portion.

In one embodiment the first and second gripping means each comprise a seal and an aperture located on the inner side of the seal, connected to a vacuum supply system, for gripping an object surface by suction.

In one embodiment the first and second fastening means are positioned one over the other, and in that the seal of the uppermost gripping means encloses a smaller area than the seal of the lowermost gripping means, and wherein the same vacuum pressure is connected to both apertures According to a second aspect, the object of the invention is fulfilled by a method for separating two objects attached to each other in a sandwich structure, comprising the steps of:
   gripping and holding a first object to a base surface by means of first fastening means,
   gripping a second object by means of second fastening means, positioned opposite to the first fastening means, and
   providing a pulling force at an angle to the normal direction of the base surface for displacing the two fastening means away from each other.

In one embodiment the method comprises the steps of:
   positioning the sandwich structure by means of a positioning mechanism to orient a periphery portion of the second object relative to the second fastening means;
   gripping the second object at said periphery portion; and
   providing the pulling force angled inwardly from said periphery portion.

In one embodiment the method comprises the steps of:
   inserting a cutting edge between the objects adjacent to said periphery portion.

In one embodiment, wherein the first and second fastening means each comprise a seal and an aperture located on the inner side of the seal, the method comprises the step of:

provide a vacuum suction force to said apertures for gripping respective outer object surfaces of the sandwich structure.

In one embodiment, wherein the first and second fastening means are positioned one over the other, and the seal of the uppermost fastening means gripping means encloses a smaller area than the seal of the lowermost gripping means, the method comprises the step of:

providing the same vacuum pressure to both apertures.

BRIEF DESCRIPTION OF THE DRAWINGS

The invention will be described in greater detail below with reference to the accompanying drawings, on which.

DETAILED DESCRIPTION OF PREFERRED EMBODIMENTS

Figure 1:
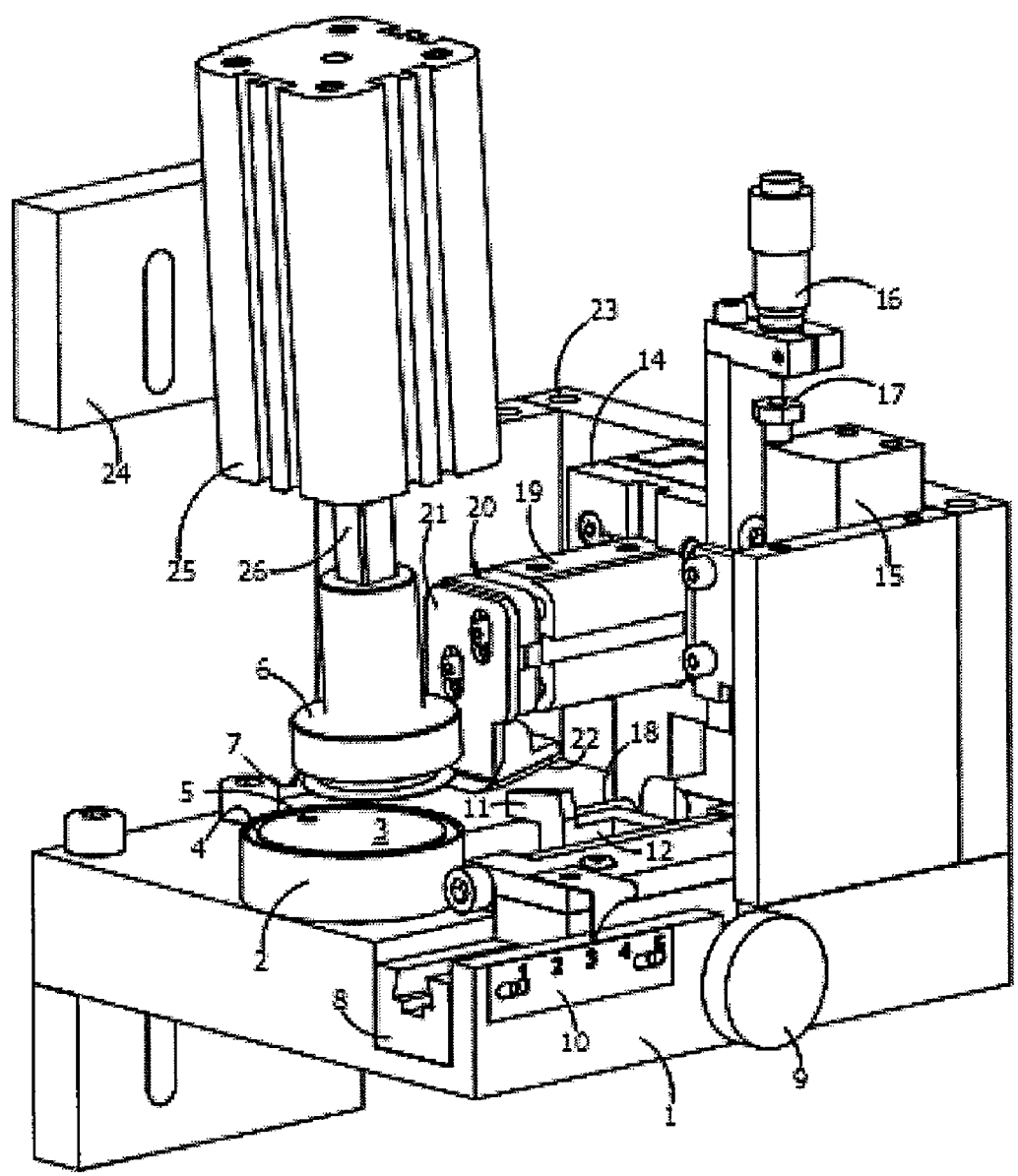
FIG. 1 schematically illustrates a separation apparatus according to an embodiment of the invention.

FIG. 1 illustrates an embodiment of the separation apparatus according to the invention. The apparatus comprises a chassis or support structure 1, to which first fastening means 2 are connected. First fastening means 2 comprises a horizontal first base surface 3, a sealing recess 4 into which an o-ring (not shown) is devised to be received, and an aperture 5 formed in the first base surface on the inner side of the sealing recess 4. A gas pressure supply system (not shown) is connected to aperture 5, for providing an under pressure compared to ambient pressure, herein referred to as vacuum. The base first surface 3 with its o-ring will support and hold a flat object thereto. Opposing the first fastening means 2 are second fastening means 6, comprising a second base surface 7. Similar to the first fastening means 2, a seal (not shown) is applied onto second base surface, forming an engagement rim. However, as will be described more detailed later, the seal provided at second fastening means is less rigid than the o-ring of first fastening means 2, and is also allowed to flex and maintain contact despite the fact that the second fastening means 6 are angled in relation to the first fastening means 2. An aperture is formed on the inner side of the engagement rim of the seal, to which aperture a gas pressure supply system is connected. Preferably, the same gas pressure system is used for both fastening means 2 and 6. As will be described below, fastening means 2 and 6 are adapted to attach and grip, by vacuum suction, opposite outer surfaces of two sandwiched objects placed in the separation apparatus, and subsequently pull apart and separate the two objects.

Preferably, the same gas pressure is provided at both apertures of the opposing support surfaces 3 and 7, whereas the surface covered within the o-ring placed in sealing recess 4 is larger than the surface covered within the engagement rim of the seal attached to second fastening means 6. This way, should the pulling force in the subsequent pulling process at any point exceed the suction produced by the vacuum supplied at the fastening means 2,6, it is the grip of second fastening means 6 of the upper object in the sandwich structure that will disengage. As a result, the sandwich structure will not risk to follow upper fastening means 6 and subsequently fall down and break, should the supply of vacuum weaken or disappear.

Chassis 1 has a horizontal portion, to which a horizontal slide mechanism 8 is displaceably connected. A stop member 11 is fixedly connected via a lever 12 to slide mechanism 8 in the direction of the displacement axis, but preferably pivotable around the displacement axis. In the illustrated embodiment, the horizontal displacement of slide mechanism 8 is manoeuvrable by means of a turning knob 9 on the chassis. A scale 10 may also be placed on the stationary portion of the chassis, and an indicator (not shown) attached to the slide mechanism 8 is then adapted to run over the scale for setting of the horizontal position along the displacement axis of the slide mechanism 8 relative to the chassis 1. A biased guiding device 13 is also slidably attached to chassis 1, comprising a pair of rollers.

Chassis 1 further comprises a vertical portion, to which a vertical slide mechanism 14 is displaceably connected. The vertical slide mechanism is vertically manoeuvred by means of a pneumatic control member 15, which is devised to displace the vertical slide mechanism downwards until a lower position setting screw 16 hits a stop surface 17, and upwards to the upper stop position as shown in FIG. 1. A stop member control lever 18 projects from the vertical slide mechanism and engages stop member 11, such that stop member 11 is held in the active stopping position shown in FIG. 1 when the vertical slide mechanism 14 is in its upper position. Preferably, stop member control lever 18 is also devised to actively pull down stop member 11 to an inactive position below the extension of first base surface 3 when vertical slide mechanism is brought down to its lower position, as will be described in further detail below. An alternative solution is to allow stop member 11 to simply fall down to the inactive position when the support of stop member control lever 18 is removed by lowering the same. Attached to the vertical slide member 14 is further a pneumatic cylinder 19, to which a horizontally acting piston 20 is connected. Attached to a head of piston 20 is a knife holder 21, carrying a knife blade 22. The angle of the edge of knife blade is preferably about 10°, with its lower edge surface nearly horizontal. Connection of a pneumatic system pressure to cylinder 19 forces piston 20 with knife 22 to move horizontally towards the fastening means 2, 6, a preset distance. Typically, the stroke of piston 20 is in the range of 3-10 mm.

A top member of chassis 1 is not shown in the drawings, for the sake of clarity, but is typically firmly attached by means of screws in bores 23 of the vertical portion of chassis 1. Further vertical support means 24 of chassis 1 are only partly displayed, and carry a pneumatic cylinder chuck 25 which realizes a pulling force mechanism for separating sandwiched objects in accordance with the invention. Chuck 25 has a displaceable piston 26, in turn carrying second fastening means 6. In accordance with a preferred embodiment of the invention, cylinder chuck 25 and piston 26 are arranged at an angle from the vertical direction of 5-15°, typically 7-10°, e.g. 8°. Chuck 25 and piston 26 are tilted in a vertical plane which is parallel to the direction of movement of piston 20, and piston 26 moves downwards towards the vertical slide mechanism 14.

Operation of the separation apparatus as shown in the drawings and described above will now be presented, for a preferred embodiment.

A preset vacuum is provided by the gas pressure supply system is turned on and provided at fastening means 2 and 6.

Figure 2:
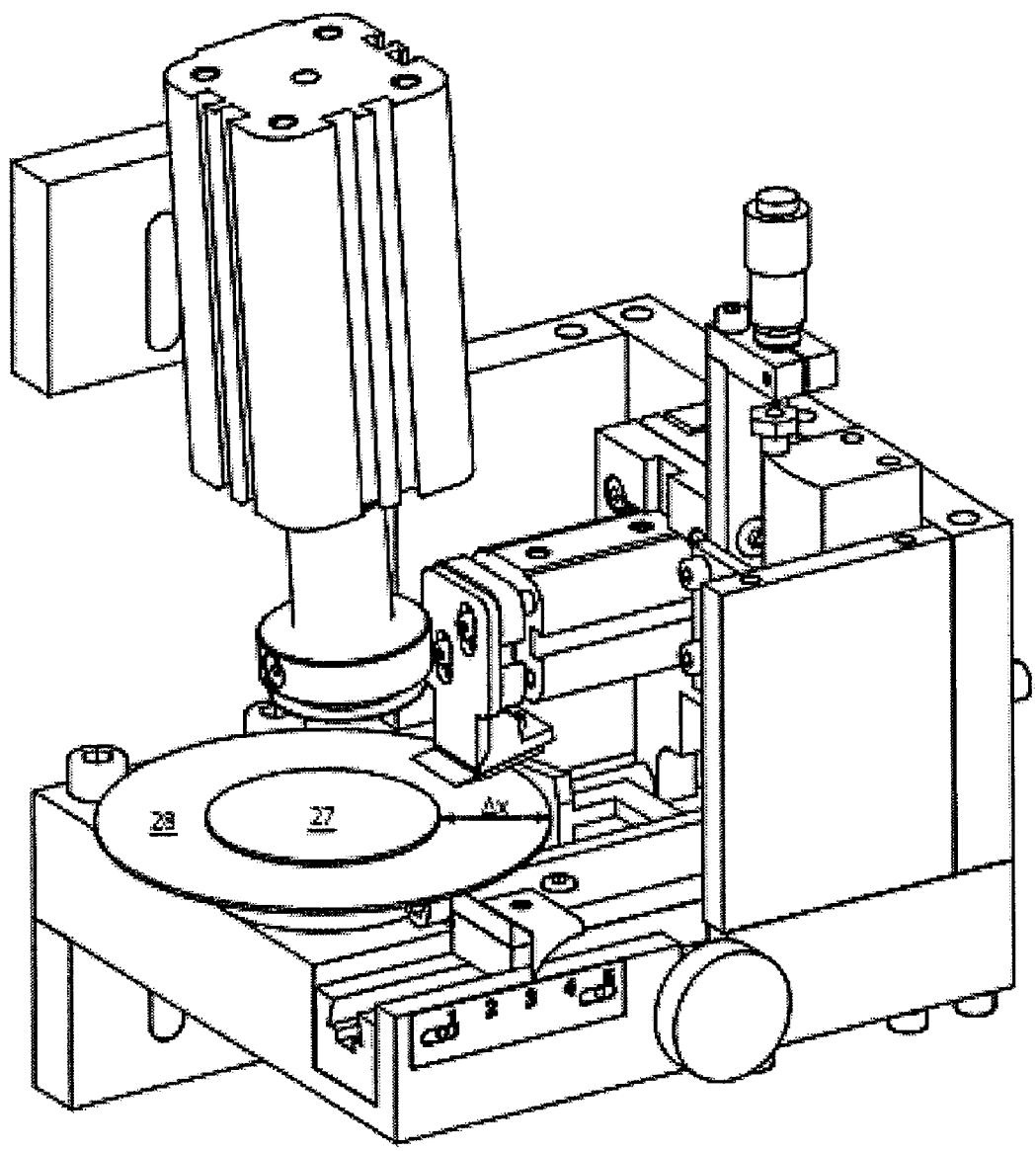
FIG. 2 illustrates the apparatus of FIG. 1 when loaded with a pair of sandwiched objects for separation.

Using the system pressure of the pneumatic control system, piston 26 has been moved up into chuck cylinder 25 to open up the apparatus, as shown in FIG. 2. Two attached flat sandwiched objects 27 and 28 are then placed in the apparatus. Typically, object 27 is an imprint stamp and object 28 is a substrate covered by a resist coating. Stamp 27 and substrate 28 have previously been pressed together such that a surface pattern on stamp 27 has been pressed into the deformable layer of the resist coating on the substrate 28, by either heating and cooling the resist material or by using a UV curable resist and exposing it to radiation after pressing the stamp 27 and substrate 28 together. In any case, objects 27 and 28 are firmly attached to each other.

The sandwich structure is placed with the diametrically smaller object over the larger object. In fact, the upper object may be larger than the lower object, but at a point of separation, to be described, the upper object should have its periphery inside of the periphery of the lower object. The distance Δx between the peripheries is measured by any suitable measuring device, and stop member 11 is displaced by means of turning knob 9 and scale 10 to the corresponding position. This operation sets the position of the periphery of upper object 27 in relation to upper fastening means 6 and knife 22.

The sandwich structure is inserted at an angle with its inner portion held down towards the rollers of guiding device 13, which are slid inwardly until the periphery of the lower object 28 hits stop member 11. The sandwich structure is then carefully dropped down and thereby gripped by first fastening means 2 through vacuum suction.

Piston 26 is then brought down to engage with the upper object 27 by means of the seal provided on the upper fastening means 6. Successful trials have been made with a standard suction cup like seal provide by Schmalz under product name SGR33, which is a silicon seal having a diameter of 33 mm and a height of about 5 mm. The height and flexibility of the silicon seal makes it appropriate for engaging and gripping by suction, even though it is held at an angle towards the upper surface of object 27. A seal with some flexible height, at least exceeding the height position difference of the highest and lowest points of its periphery in relation to the plane of the first base surface 3, is consequently preferred, the mentioned type being just one example. In an alternative embodiment, the pulling force may be angled as described, whereas the seal of second fastening means 6 has a lower rim which is parallel or near parallel to the first base surface of the first fastening means 2.

Once engaged, both objects are held firmly by the opposing fastening means 2 and 6, by vacuum suction.

Vertical slide mechanism 14 is then brought down to place knife 22 just outwardly of the periphery of the upper object. The thickness of the lower object 28 is either known or measured, and this information is used to set screw 16 appropriately such that knife 22 is positioned onto the upper surface of the lower object without scratching the same. The accuracy should be in the range of a few hundreds of a millimeter. A further development of this feature includes a built-in measuring device, operable to sense the position of the upper surface of the lower object, and to position the knife 22 in relation thereto, e.g. using an optical Interferometric solution known as such.

Next, a pulling force is applied to piston 26 by means of cylinder chuck 25 and the pneumatic gas pressure. The system pressure of the gas pressure supply system is typically 8 bar, and the pulling force provided to piston 26 is either actively controlled or preset to be just lower than the suction force provided by the upper fastening means to upper object 27. In a preferred embodiment, the pulling force is supplied a few seconds before knife 22 is activated, and results have shown that in about 3 cases out of four the pulling action is sufficient to separate the objects, thanks to the periphery-located pulling, and the angle of the pulling force being directed to lift the upper object at the periphery of engagement first. However, pneumatic cylinder 19 is devised to set full system pressure to eject piston 20 with knife 22 a preset distance towards the centre of the objects. Preferably, the setting of the horizontal slide mechanism 8 positions the knife such that it will eject a few tens of millimeters into the resist layer between the objects 27 and 28, typically about 0.5 mm. As mentioned, the apparatus may be set to eject the knife immediately upon provision of the pulling force to piston 26, or a preset time later, and a control system of the apparatus may even be devised to hold ejection of the knife if it is detected that separation has already been completed before the present time.

Figure 3:
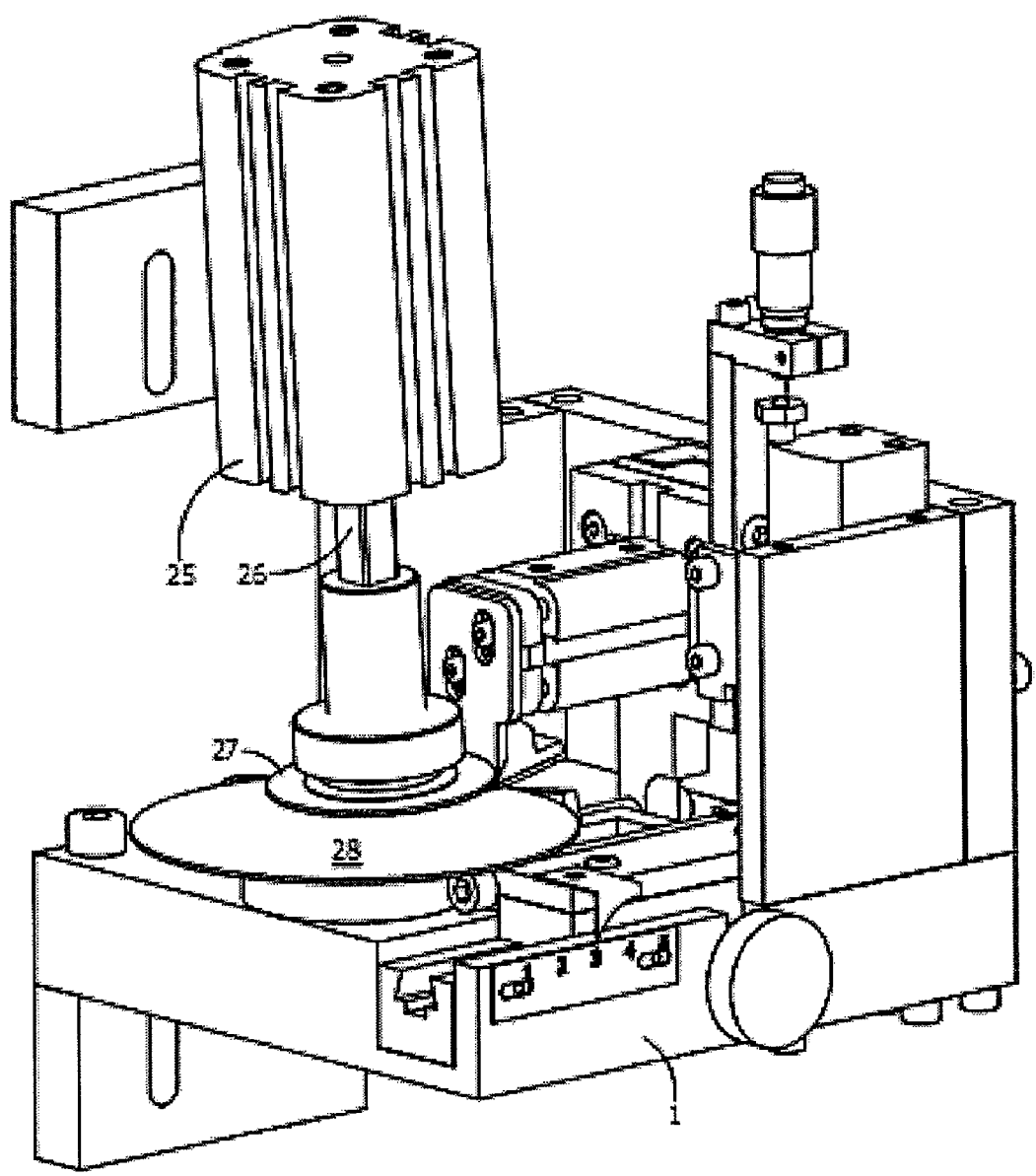
FIG. 3 illustrates the apparatus of FIG. 1 after separation.

If the mere pulling force has not been sufficient, the ejection of knife 22 into the resist layer at the periphery point of engagement of objects 27 and 28 will provide a sufficient notch in the resist layer to initiate separation by letting in the tiniest amount of air, and the pulling force supplied by piston 26 will then separate the objects to the position shown in FIG. 3.

Figure 4:
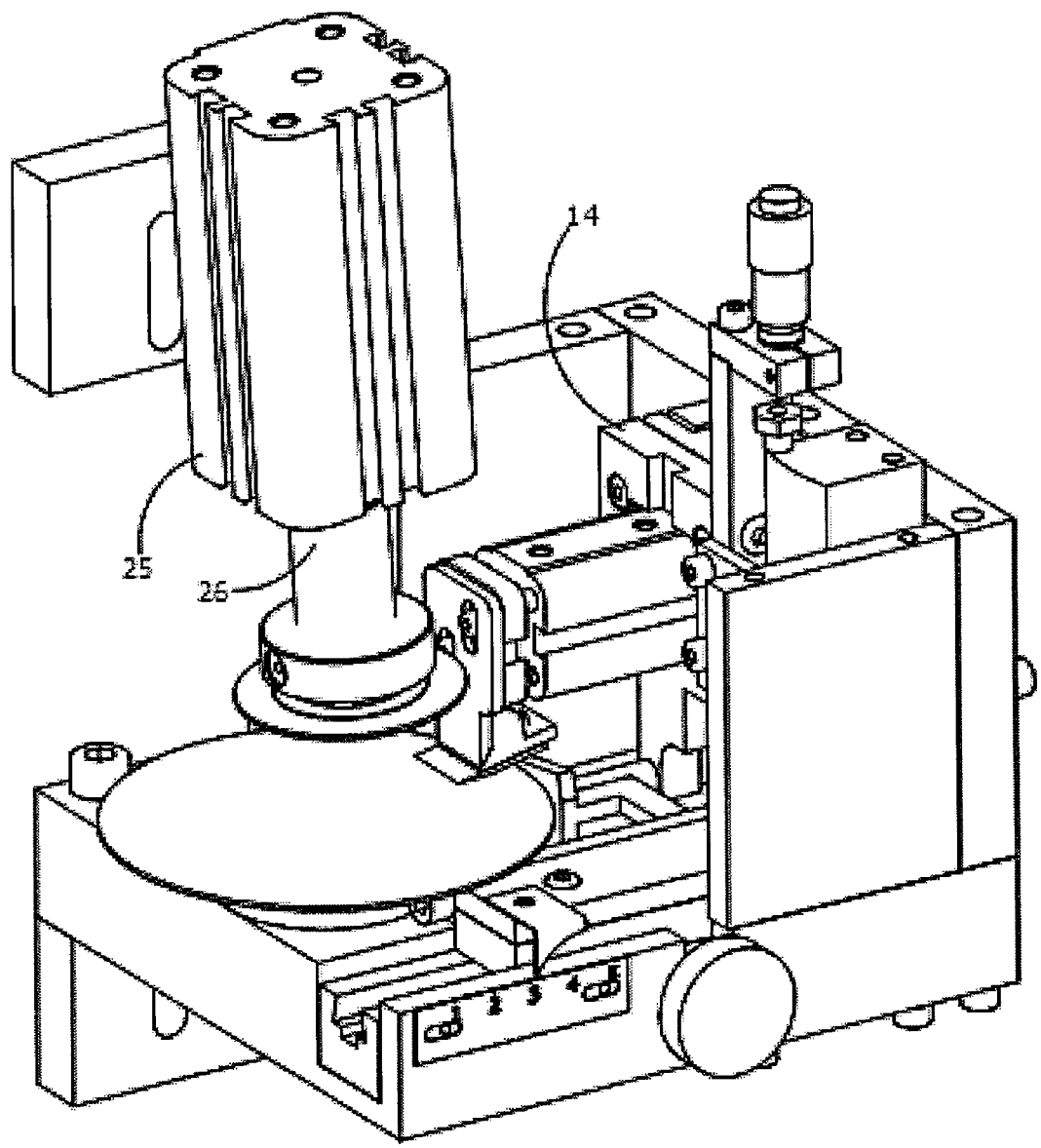
FIG. 4 illustrates the separated objects in the apparatus prior to removal of the objects from the apparatus.

Finally, as shown in FIG. 4, piston 26 is withdrawn into cylinder 25 and the vertical slide 14 is lifted to its upper position, upon which the separated objects are ready to be removed from the apparatus. In a preferred embodiment, an automatic carrier is inserted between the objects with a soft and clean bed, after which the vacuum is released such that the upper object falls down onto the bed and is subsequently pulled out. The lower object may be taken out by hand, or by an automatic periphery-gripping device.

The apparatus and the method for operating the same, have been proven highly efficient for separating firmly attached objects, and is particularly useful in the post imprint process for separating a stamp from a substrate. Other fields of application are foreseeable, though, e.g. for separating objects that have been glued together. Fastening and holding of objects to be separated have been presented by means of vacuum suction, but the object gripping feature may also be provided by mechanical gripping means, such as chuck jaws, dependent on the type and dimensions of the objects to be separated. The invention is only limited by the appended claims.

The invention claimed is:

1. Apparatus for separating two objects attached to each other in a sandwich structure, comprising:
   a support structure, carrying
   a first fastening member having a base surface and a first gripping member for supporting and holding a first object,
   a second fastening member, positioned opposite to the first fastening member, having a second gripping member for holding a second object by suction force to a surface of the second object facing away from the first object,
   wherein the first and second gripping members each comprise a seal and an aperture located on the inner side of the seal connected to a vacuum supply system for gripping an object surface by suction,
   the first and second fastening members being positioned one over the other, and the seal of the uppermost fastening member enclosing a smaller area than the seal of the lowermost fastening member,
   wherein the same vacuum pressure is provided to both apertures; and
   a pulling force mechanism devised to provide a pulling force at an angle to the normal direction of the base surface for displacing the two fastening members away from each other.

2. The apparatus of claim 1, comprising
a positioning mechanism for positioning the sandwich structure in the apparatus such that the second fastening member is directed to engage and grip the second object at a periphery portion thereof, from which periphery portion the pulling force mechanism is angled inwards.

3. The apparatus of claim 1, comprising
a cutting mechanism, operable to insert a cutting edge between the objects.

4. The apparatus according to one of claims 2 and 3, wherein the cutting mechanism is connected to the positioning mechanism such that the cutting edge is arranged to be inserted between the objects adjacent to said periphery portion.

5. The apparatus of claim 1, wherein the second fastening member is displaceably connected to the support structure through the pulling force mechanism, such that the second fastening member is axially displaceable away from the first fastening member at said angle.

6. The apparatus of claim 1, wherein the pulling force mechanism connects the second fastening member to the support structure, and comprises a cylinder and a piston connected to the cylinder, wherein the piston runs in the cylinder to axially displace the second fastening member at said angle.

7. The apparatus of claim 1, wherein the seal of the second gripping member comprises a suction cup having a flexible wall capable of flexing by said angle and grip to a surface when flexed at said angle.

8. Method for separating two objects attached to each other in a sandwich structure, comprising the steps of:
gripping and holding a first object to a base surface by means of a first fastening member,
gripping a second object by means of a second fastening member, positioned opposite to the first fastening member by suction force to a surface of the second object facing away from the first object, and
providing a pulling force at an angle to the normal direction of the base surface for displacing the two fastening members away from each other,
wherein the first and second fastening members each comprise a seal and an aperture located on the inner side of the seal, comprising the step of:
providing a vacuum suction force to said apertures for gripping respective outer object surfaces of the sandwich structure,
wherein the first and second fastening members are positioned one over the other, and the seal of the uppermost fastening member encloses a smaller area than the seal of the lowermost fastening member, comprising the additional step of:
providing the same vacuum pressure to both apertures.

9. The method of claim 8, comprising the steps of:
positioning the sandwich structure by means of a positioning mechanism to orient a periphery portion of the second object relative to the second fastening member;
gripping the second object at said periphery portion; and
providing the pulling force angled inwardly from said periphery portion.

10. The method of claim 9, comprising the steps of:
inserting a cutting edge between the objects adjacent to said periphery portion.

* * * * *